(12) United States Patent
Okajima et al.

(10) Patent No.: US 10,789,227 B2
(45) Date of Patent: Sep. 29, 2020

(54) DATA STRUCTURE, INFORMATION PROCESSING DEVICE, INFORMATION PROCESSING METHOD, AND PROGRAM RECORDING MEDIUM

(71) Applicant: NEC Solution Innovators, Ltd., Koto-ku, Tokyo (JP)

(72) Inventors: Yuzuru Okajima, Tokyo (JP); Kouichi Maruyama, Tokyo (JP)

(73) Assignee: NEC SOLUTION INNOVATORS, LTD, Tokyo (JP)

( * ) Notice: Subject to any disclaimer, the term of this patent is extended or adjusted under 35 U.S.C. 154(b) by 482 days.

(21) Appl. No.: 15/127,479

(22) PCT Filed: Mar. 20, 2015

(86) PCT No.: PCT/JP2015/001568
§ 371 (c)(1),
(2) Date: Sep. 20, 2016

(87) PCT Pub. No.: WO2015/151444
PCT Pub. Date: Oct. 8, 2015

(65) Prior Publication Data
US 2017/0132262 A1    May 11, 2017

(30) Foreign Application Priority Data
Mar. 31, 2014  (JP) ................................ 2014-073545

(51) Int. Cl.
*G06F 16/00*  (2019.01)
*G06F 16/22*  (2019.01)
(Continued)

(52) U.S. Cl.
CPC ............ *G06F 16/2237* (2019.01); *G06F 7/00* (2013.01); *G06F 7/22* (2013.01); *H03M 7/30* (2013.01);
(Continued)

(58) Field of Classification Search
CPC ..... G06F 7/00; G06F 7/30; G06F 7/46; G06F 7/22; H03M 7/30; H03M 7/46;
(Continued)

(56) References Cited

U.S. PATENT DOCUMENTS 8,453,032 B2 *   5/2013   Ross .................. G11B 20/1833
                                                    714/48
8,831,229 B2 *   9/2014   Chang .................. H04L 9/0819
                                                    380/283
(Continued)

OTHER PUBLICATIONS

Bit Stream Compression Used for FPGA Using Golomb Coding, IEEE, Kumar et al., (Year: 2013).*
(Continued)

*Primary Examiner* — Jean M Corrielus

(57) ABSTRACT

[Problem] To suppress increases in the size of a fully indexable dictionary while making it possible for a target bit stream to be subjected to two types of selection operation employing the fully indexable dictionary.
[Solution] An information processing device (100) is provided with a storage unit (10) which stores a data structure (11) used to represent a bit stream formed using a first value and a second value. The data structure (11) includes: first data specifying the positions on the bit stream of all or some succession segments including a succession of one or more of the first value or the second value; second data specifying, for some of the succession segments, the number of first values that have appeared on the bit stream from the beginning of the bit stream as far as the succession segment; and third data specifying, for some of the succession segments, the number of second values that have appeared on the bit stream from the beginning of the bit stream as far as the succession segment.

13 Claims, 7 Drawing Sheets

|  | 0 | 1 | 2 | 3 | 4 | 5 | 6 | 7 | 8 | 9 | 10 | 11 |  | DESCRIPTION |
|---|---|---|---|---|---|---|---|---|---|---|---|---|---|---|
| BIT STREAM B | 0 | 0 | 1 | 1 | 1 | 0 | 0 | 1 | 1 | 0 | 1 | 1 |  | ORIGINAL DATA |
| START POSITION |  |  | 1 |  |  |  |  | 2 |  |  | 3 |  | 4 |  |
| pos1 | 0 | 1 | 2 | 3 | 4 | 5 | 6 | 7 | 8 | 9 | 10 | 11 | 12 | POSITION |
| rank1 | 0 | 0 | 0 | 1 | 2 | 3 | 3 | 3 | 4 | 5 | 5 | 6 | 7 | rank1 |
| rank0 | 0 | 1 | 2 | 2 | 2 | 2 | 3 | 4 | 4 | 4 | 5 | 5 | 5 | rank0 |
| select1 |  |  | 0 | 1 | 2 |  |  | 3 | 4 |  | 5 | 6 |  |  |
| select0 | 0 | 1 |  |  |  | 2 | 3 |  |  | 4 |  |  |  |  |

(51) Int. Cl.
*G06F 7/00* (2006.01)
*H03M 7/40* (2006.01)
*G06F 7/22* (2006.01)
*H03M 7/30* (2006.01)
*H03M 7/46* (2006.01)

(52) U.S. Cl.
CPC ....... *H03M 7/3082* (2013.01); *H03M 7/3088* (2013.01); *H03M 7/4006* (2013.01); *H03M 7/4031* (2013.01); *H03M 7/46* (2013.01); *H03M 7/707* (2013.01)

(58) Field of Classification Search
CPC ............. H03M 7/4031; H03M 7/3082; H03M 7/3088; H03M 7/4006
See application file for complete search history.

(56) References Cited

U.S. PATENT DOCUMENTS

| | | | | |
|---|---|---|---|---|
| 9,584,432 | B2* | 2/2017 | Welin | G10L 25/78 |
| 2003/0206124 | A1* | 11/2003 | Lovell | H03M 9/00 |
| | | | | 341/50 |
| 2007/0011734 | A1* | 1/2007 | Balakrishnan | H04L 43/026 |
| | | | | 726/13 |
| 2008/0030383 | A1* | 2/2008 | Cameron | G06F 17/277 |
| | | | | 341/55 |
| 2008/0040345 | A1* | 2/2008 | Cameron | G06F 7/02 |
| 2008/0152235 | A1* | 6/2008 | Bashyam | H04N 19/91 |
| | | | | 382/224 |
| 2013/0044881 | A1* | 2/2013 | Chang | H04L 9/0819 |
| | | | | 380/278 |
| 2013/0144895 | A1* | 6/2013 | Cameron | G06F 17/277 |
| | | | | 707/755 |
| 2013/0297575 | A1* | 11/2013 | Fallon | G06F 16/22 |
| | | | | 707/693 |
| 2015/0002320 | A1* | 1/2015 | Kataoka | H03M 7/46 |
| | | | | 341/65 |
| 2015/0116136 | A1* | 4/2015 | Cameron | G06F 17/277 |
| | | | | 341/55 |

OTHER PUBLICATIONS

A Compact Rank/Select Data Structure for the Streaming Model, IEEE, Gpmzales et al., (Year: 2019).*
Daisuke Okanohara, "High-speed string analysis, data compression/full-text search/text mining (Series in Science of Probability and Informatics)" (in Japanese, Kosoku Mojiretsu Kaiseki no Sekai, Data Assyuku/Zenbun Kensaku/Text Mining(Series Kakuritsu to Jouhou no Kagaku)), Iwanami Shoten, Dec. 27, 2012.
Veli Makinen et al., "Storage and Retrieval of Highly Repetitive Sequence Collections" [online], Journal of Computational Biology, 17(3), Apr. 8, 2010, p. 281-308.
A. Gupta, W.K. Hon, R. Shah, and J.S. Vitter, "Compressed data structures: Dictionaries and data-aware measures", In Proc. 16th Data Compression Conference (DCC), pp. 213-222, 2006.
Daisuke Okanohara, "Succinct Data Structure", IPSJ Magazine, vol. 53, No. 5, Information Processing Society of Japan, Apr. 15, 2012, p. 504-512.
Daisuke Okanohara, "Large-Scale String Processing: Theory and Practice", The Technical Report of the Proceeding of the Institute of Electronics, Information and Communication Engineers, vol. 110, No. 76, The Institute of Electronics, Information and Communication Engineers, Jun. 7, 2010, p. 15-22.
Kunihiko Sadakane, "Succinct Data Structures for Large-Scale Data Processing", IPSJ Magazine, vol. 48, No. 8, Information Processing Society of Japan, Aug. 15, 2007, p. 899-902.
International Search Report for PCT Application No. PCT/JP2015/001568, dated Jun. 23, 2015.
English translation of Written opinion for PCT Application No. PCT/JP2015/001568.
Sunho Lee et al.,"Dynamic rank/select structures with applications to run-length encoded texts", Theoretical Computer Science, Oct. 9, 2009, pp. 4402-4413, vol. 410, No. 43, Elsevier, Amsterdam, Netherlands.
Roberto Grossi et al., "More Haste, Less Waste: Lowering the Redundancy in Fully Indexable Dictionaries", 26th International Symposium on Theoretical Aspects of Computer Science Stacs 2009, Feb. 16, 2009, pp. 517-528, Freiburg, Germany.
Dong Zhou et al., "Space-Efficient, High-Performance Rank & Select Structures on Uncompressed Bit Sequences", 12th International Symposium on Experimental Algorithms (SEA 2013), Jun. 2013, pp. 151-163, Rome, Italy.
Extended European Search Report for EP Application No. EP15772790.0 dated Oct. 26, 2017.

* cited by examiner

Fig.3

| DESCRIPTION | 0 | 1 | 2 | 3 | 4 | 5 | 6 | 7 | 8 | 9 | 10 | 11 | |
|---|---|---|---|---|---|---|---|---|---|---|---|---|---|
| BIT STREAM B | 0 | 0 | 1 | 1 | 1 | 0 | 0 | 1 | 1 | 0 | 1 | 1 | |
| ORIGINAL DATA | | | | | | | | | | | | | |
| START POSITION | | | 1 | | | | | 2 | | | 3 | | 4 |
| pos1 | 0 | 1 | 2 | 3 | 4 | 5 | 6 | 7 | 8 | 9 | 10 | 11 | 12 |
| rank1 | 0 | 0 | 1 | 1 | 2 | 3 | 3 | 3 | 4 | 5 | 5 | 6 | 7 |
| rank0 | 0 | 1 | 2 | 2 | 2 | 2 | 3 | 4 | 4 | 4 | 5 | 5 | 5 |
| select1 | | | | | | | | | | | | | |
| select0 | 0 | 1 | 2 | | 2 | 3 | | 4 | | | 5 | 6 | |

Fig.4

| SUCCESSION SEGMENT POSITION DATA B1 | 0 | 1 | 2 | 3 | 4 | 5 | 6 | 7 | 8 | 9 | 10 | 11 | 12 |
|---|---|---|---|---|---|---|---|---|---|---|---|---|---|
| | 0 | 0 | 1 | 0 | 0 | 0 | 0 | 1 | 0 | 0 | 1 | 0 | 1 |

| rank1 DATA Br1 | 0 | 1 | 2 | 3 | 4 | 5 | 6 | 7 |
|---|---|---|---|---|---|---|---|---|
| | 0 | 0 | 0 | 1 | 0 | 0 | 0 | 1 |

| rank0 DATA Br0 | 0 | 1 | 2 | 3 | 4 | 5 |
|---|---|---|---|---|---|---|
| | 0 | 0 | 1 | 0 | 0 | 1 |

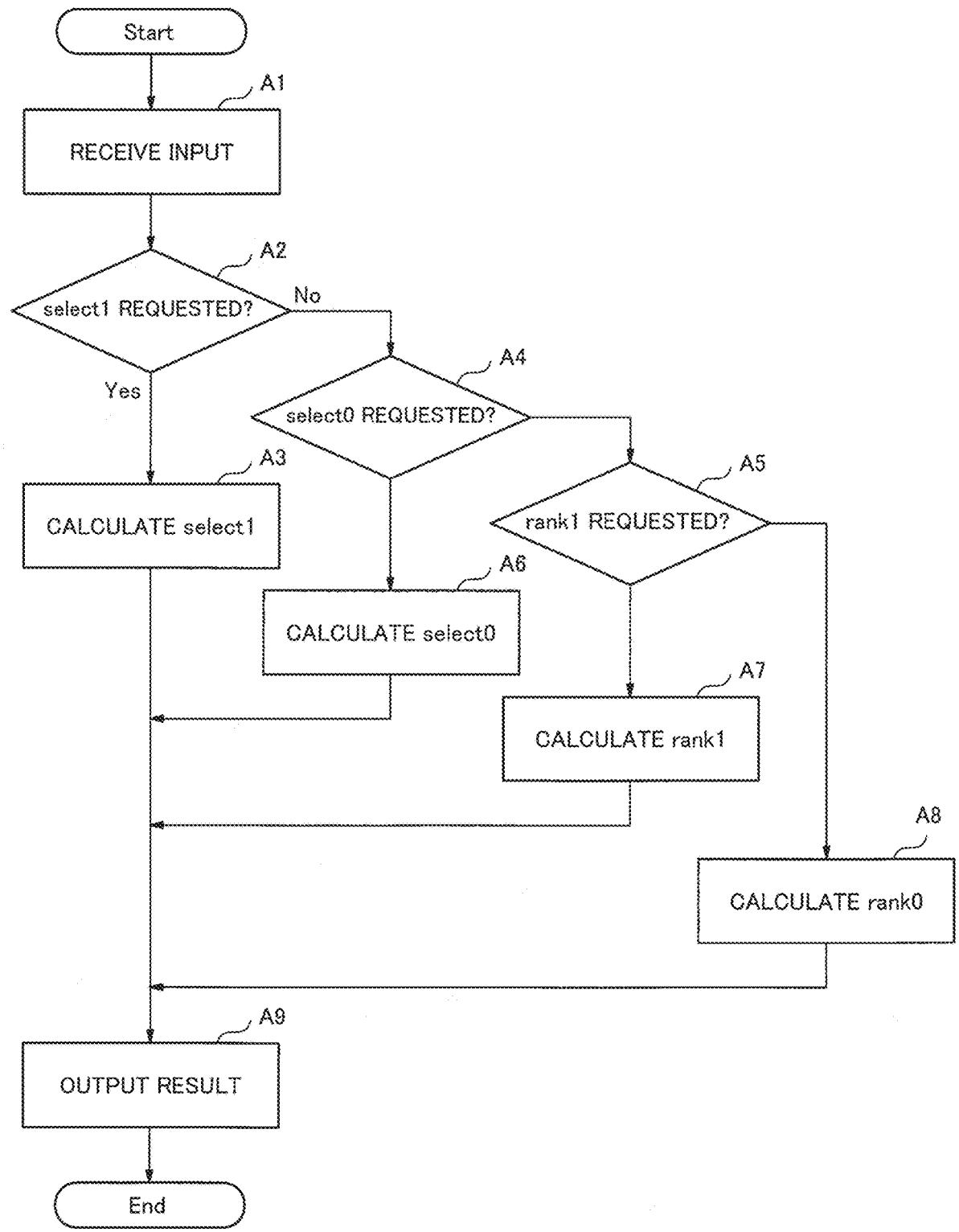

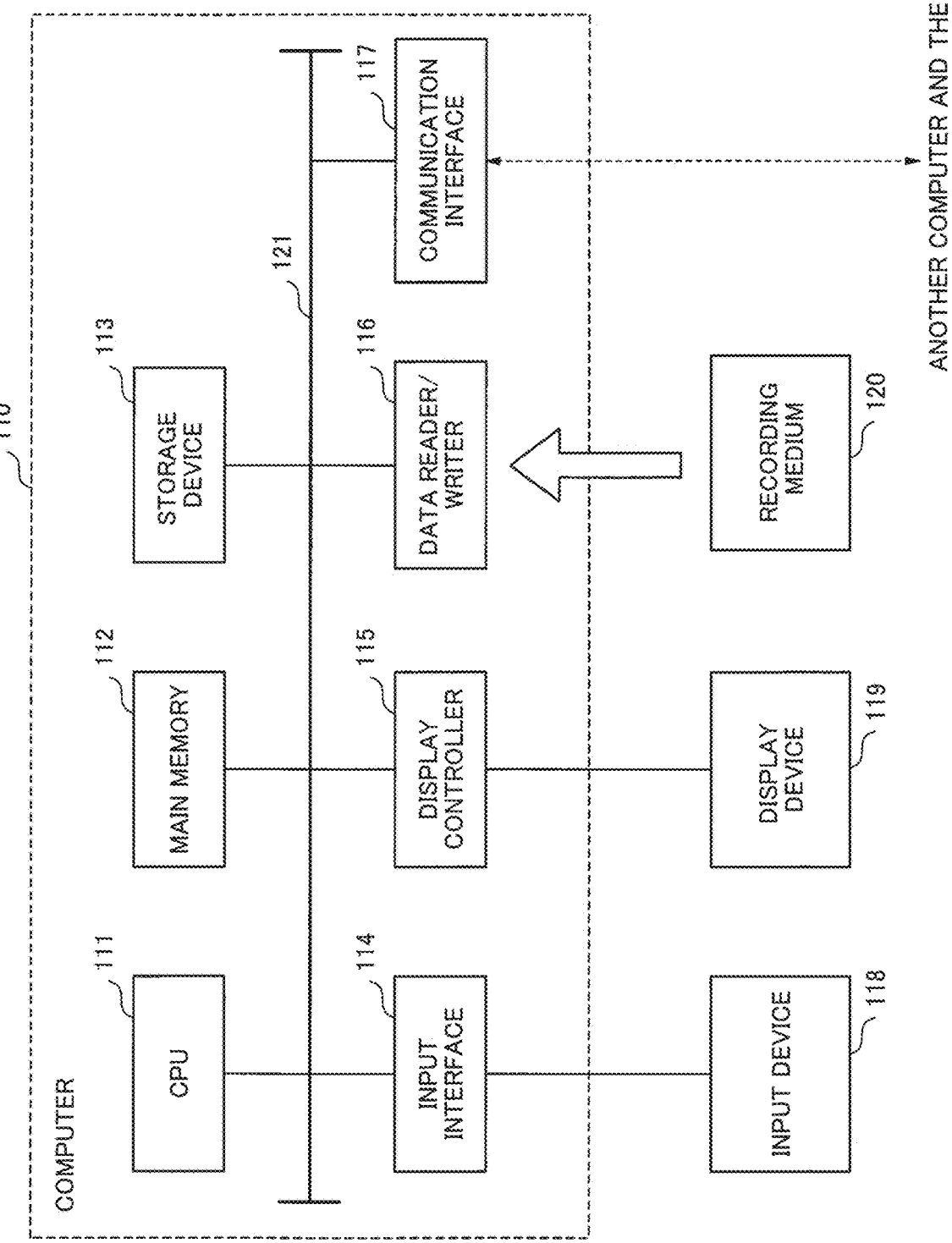

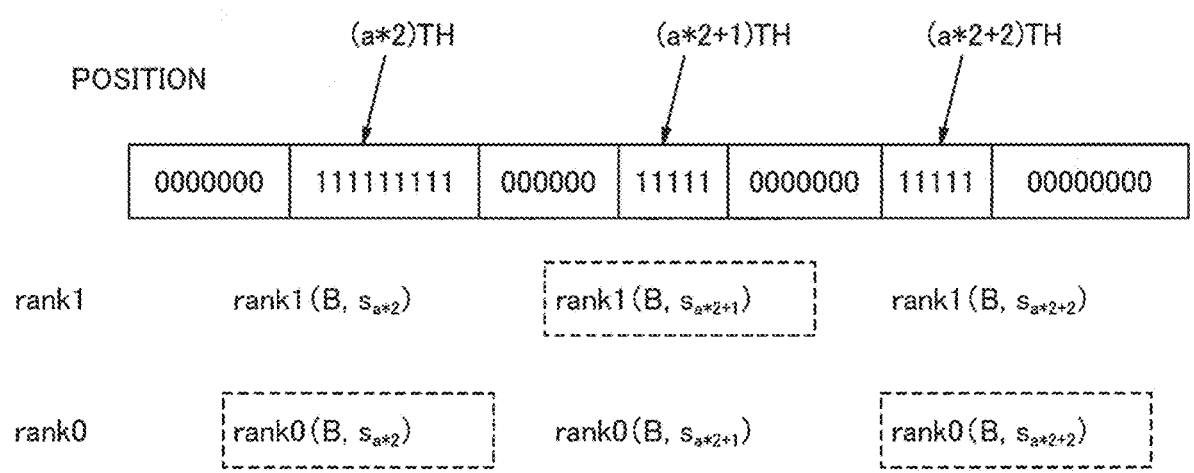

DATA STRUCTURE, INFORMATION PROCESSING DEVICE, INFORMATION PROCESSING METHOD, AND PROGRAM RECORDING MEDIUM

This application is a National Stage Entry of PCT/JP2015/001568 filed on Mar. 20, 2015, which claims priority from Japanese Patent Application 2014-073545 filed on Mar. 31, 2014, the contents of all of which are incorporated herein by reference, in their entirety.

TECHNICAL FIELD

The present invention relates to a data structure, an information processing device, an information processing method, and a program recording medium recording a program for achieving the foregoing, and in particular relates to a data structure, an information processing device, an information processing method, and a program recording medium for performing efficient calculation on a bit stream.

Recent years, a data structure referred to as a fully indexable dictionary has been drawing attention (for example, see NPL 1). The fully indexable dictionary is a data structure that supports two types of operations, which are individually referred to as rank and select, for a bit stream B of length n. The two types of operations are defined as follows. Note that in the following description, it is assumed that the first element of the bit stream B is denoted by $B[0]$ and the last element of the bit stream B is denoted by $B[n-1]$, a partial stream composed of elements from the i-th element to j-th element on the bit stream B is denoted by $B[i, j]$, and a partial stream that does not include the j-th element, which is the terminal thereof, is denoted by $B[i, j)$.

First, "rank1(B, i)" is an operation that returns the number of 1s existing in the interval of $B[0, i)$. "rank0(B, i)" is an operation that returns the number of 0s existing in the interval of $B[0, i)$. select1(B, i) is an operation that returns a position where the (i+1)th 1 appears in the bit stream B. select0(B, i) is an operation that returns a position where the (i+1)th 0 appears in the bit stream B.

In addition to the above operations, an operation that returns the value $B[i]$ of the i-th element, denoted by access(B, i), is sometimes supported by a fully indexable dictionary. While a fully indexable dictionary is referred to as "succinct bit vector", "rank/select dictionary" or the like in some literatures, all of these mean the same data structure.

A fully indexable dictionary serves as a foundation for constructing a space-saving data structure referred to as a succinct data structure. A succinct data structure is a data structure for representing various data structures, such as a tree structure, a graph structure, and text data, in small data structures and has collected attention as a technology for dealing with large scale data. Moreover, the size of a succinct data structure depends on the size of a fully indexable dictionary that serves as a foundation. Thus, achieving a fully indexable dictionary in as small a size as possible is a key factor in coping with large scale data. This point will be described below.

First, a method of achieving a fully indexable dictionary by adding an auxiliary structure to the bit stream while maintaining an original bit stream B as it is without compression has been known. The method is described in "4.2.3 Dense Case" in NPL 1 cited below. In the description, such a fully indexable dictionary that has been not compressed is referred to as an "uncompressed fully indexable dictionary" and assumed to have been provided in advance.

On the other hand, when appearance distribution of 1s and 0s in the original bit stream has some characteristics, there is a possibility that the bit stream may be compressed. In such a case, a method that, achieves a fully indexable dictionary of the bit stream while compressing the bit stream has been known. Such a method has an advantage of enabling a fully indexable dictionary with a smaller size than the original bit stream B to be achieved. However, different compression methods are used for a fully indexable dictionary depending on distribution of 1s and 0s in the original bit stream.

First, a compression method for a fully indexable dictionary of a bit stream, in which most of the elements are occupied by a 0, and a 1 rarely exists, will be described. As used herein, such a bit stream is referred to as "sparse bit stream". Such sparse bit streams include, for example, a bit stream "0000010000001000000".

A method of achieving a fully indexable dictionary by focusing on appearance positions of 1s while compressing a bit stream is known. A method disclosed in NPL 1 (see "4.2.4 Sparse Case") will be described herein.

The method is referred to as "Elias-Fano representation" or "sdarray". It is assumed that m number of 1s are included in a bit stream B. A case in which a bit stream is sparse is equivalent to a case m<<n holds. In this case, a monotonically increasing array P of length m that contains positions where is appear is considered. The array P is defined as $P[i]$, select1(B, i). As used herein, n represents the length of a bit stream.

When a floor function is denoted by floor( ), p is defined as p=floor(log(n/m)). In the description, however, the base of a logarithm is assumed to be 2. Then, an array L and an array H, both of length m, as described below are considered.

It is assumed that the array $L[i]$ holds sets of lower p bits of the monotonically increasing array $P[i]$, and the array $H[i]$ holds sets of the other higher bits of the monotonically increasing array $P[i]$. That is, it is assumed that $P[i]=2p \cdot H[i]+L[i]$ holds. In this case, the array H is a non-strictly monotonically increasing sequence.

An array D that satisfies $D[i]=H[i]-H[i-1]+1$ is now considered. The array D is a positive integer sequence. A bit stream E that represents the array D using unary codes is also considered. The bit stream is expressed in bits of length 2m. In this case, a fully indexable dictionary for the bit stream E can be constructed. The fully indexable dictionary of the bit stream E can be achieved in 2m+o(m) bits.

A fully indexable dictionary of a sparse bit stream is a combination of the uncompressed fully indexable dictionary of the array E and the bit array L. Thus, since the array L has a length of m log(n/m) bits and the fully indexable dictionary of the array E is expressed in 2m+o(m) bits, the total size is m log(n/m)+2m+o(m) bits. The size becomes smaller than the size of the original array B of length n bits in a case of a sparse bit stream where m<<n holds.

In a fully indexable dictionary achieved by the method disclosed in NPL 1, select1(B, i) can be calculated using Math. 1 described below.

$$\text{select1}(B,i)=2^p(\text{select1}(E,i)-i)+L[i] \qquad [\text{Math. 1}]$$

In addition, rank1(B, i) can be calculated in the following manner. First, by counting the number of "0"s using the fully indexable dictionary of the bit stream E, t is calculated that gives a position of the smallest higher bits $H[t]$ that is the same as the higher bits of i or that is greater than the higher bits of i. By adding the $H[t]$ to corresponding lower bits $L[t]$, a value of $P[t]$ is calculated. Subsequently, t is incremented by one, and, when the largest value of P[t] that does not exceed i is obtained, a value of t giving the value of P[t] represents the number of "1"s that exist in an interval to the position i.

In this case, note that, once the value of P[t] is obtained, a value of P[t−1] or a value of P[t+1] can be calculated without searching the array E and the array L from the beginning again when the value of P[t−1] or the value of P[t+1] is to be obtained. That is because in the array L and the array E, storage areas in which values related to P[t] are held have been already found, and thus looking up values stored in areas adjacent to the areas enables the value of P[t−1] or the value of P[t+1] to be calculated easily. As described above, it is also possible to regard that a fully indexable dictionary of a sparse bit stream represents a monotonically increasing array P in an efficient manner.

In addition to the above method, methods for representing the fully indexable dictionary of a sparse bit stream include a method disclosed in NPL 3. By using either of the methods disclosed in NPL 1 and NPL 3, the fully indexable dictionary of a sparse bit stream can be represented efficiently.

Subsequently, a compression method for a fully indexable dictionary of a bit stream in which both 1 and 0 appear successively will be described. Examples of such bit streams include a bit stream such as "0000111100001111". While a sparse bit stream is a bit stream in which long successions of 0s are included, long successions of 1s are also included in this bit stream, and this bit stream differs from a sparse bit stream in this respect. In the description, a region of succession of 1s is referred to as "run". For example, the above-described bit stream example includes two runs. A fully indexable dictionary of a bit stream including successions of 1s and 0s can be efficiently represented using run-length compression.

Specifically, NPL 2 discloses a method for achieving a fully indexable dictionary by applying the run-length compression to such a bit stream including successions of 1s and 0s (see "3.1 Run-Length Encoded Wavelet Tree").

Although a succession of 1s is referred to as "1-bit run" and a succession of 0s is referred to as "0-bit run", in NPL 2, in the description, a succession of 1s is referred to as "run" as described above, unless particularly specified. In the description, a succession of 0s is referred to as "space". Therefore, such bit streams as exemplified by "0000111100001111" can be regarded as a bit stream in which runs and spaces alternately appear. The method disclosed in NPL 2 will be described below.

First, it is assumed that a bit stream B including successions of 1s and 0s is given. In this case, representing the bit stream B by two sparse bit streams B1 and Br1 is considered. The number of runs included in the bit stream B is assumed to be b. The bit stream B1 is assumed to be a sparse bit stream that a 1 appears only at the start positions of all the run. When expressed in a mathematical formula, the bit B1 is expressed by Math. 2 below. In the mathematical formulae in the description, B1 is expressed as $B^1$.

$$B^1[i]=1 \text{ only if } B[i]=1 \text{ and } B[i-1]=0 \quad \text{[Math. 2]}$$

Since the number of runs included in the bit stream B is b, b number of 1s are included in the bit stream B1. The bit stream Br1 is a sparse bit stream that is obtained by joining resultant bit streams from expressing the lengths of all the runs using unary codes. The bit stream Br1 also includes b number of 1s. Moreover, since both the bit stream B1 and the bit stream Br1 are sparse bit streams, fully indexable dictionaries may be efficiently constructed using the fully indexable dictionary of a sparse bit stream described in NPL 1.

In NPL 2, the fully indexable dictionary of a sparse bit stream disclosed in NPL 3 is supposed to be used, instead of the fully indexable dictionary of a sparse bit stream disclosed in NPL 1. However, both fully indexable dictionaries are the same in respect of achieving rank and select, and whichever fully indexable dictionary is used does not makes any difference in an operation. The following description will be made using the fully indexable dictionary of a sparse bit stream described in NPL 1.

The bit stream Br1 may also be regarded as a bit stream that preserves a value of rank1(B, i) at the start position i of the r-th run. That is, in the bit stream Br1, the position of the r-th of 1 where counted from the beginning represents a value of rank1(B, i) at the start position i of the r-th run. Therefore, Math. 3 below holds. In the mathematical formulae in the description, Br1 is expressed as $B^{r1}$.

$$\text{rank1}(B,i)=\text{select}(B^{r1},r) \quad \text{[Math. 3]}$$

As described above, since a bit stream B can be represented by a bit stream B1 and a bit stream Br1, three types of operations on a bit stream B, namely, rank1, rank0 and select1, can be calculated by using the fully indexable dictionaries of the bit stream B1 and the bit stream Br1.

Specifically, when a bit stream B is represented by a bit stream B1 and a bit stream Br1, rank1(B, i) can be calculated as follows. First, r=rank1(B1, i) is calculated. r represents the number of runs that start at positions anterior to a position i in the bit stream B. If r=0, it is established that no 1 exists in the interval [0, i), rank1(B, i)=0 is obtained, and thus the calculation is finished.

On the other hand, if r>=1, the start position j of the r-th run is considered. j can be calculated using j=select1(B1, r−1). rank1(B, i) which is sought is obtained by adding the number of 1s in the interval [0, j−1] and the number of 1s in the interval [j, i).

The number of 1s in the interval [0, j−1] can be calculated in the following manner. First, if r=1, since the run is the first run, the number of 1s in the interval [0, j−1] is 0. If r>1, the number of 1s in the interval [0, j−1] is the total of the lengths of r−1 runs and can be calculated by select1(Br1, r−1). Next, the length of the r-th run is assumed to be k. In this case, k can be calculated by Math. 4 below. The number of 1s in the interval [j, i) can be calculated by Math. 5 below. In addition, rank0(B, i) can be calculated easily by Math. 6 below.

$$k = select1(B^{r1}, r) \cdot select1(B^{r1}, r-1) \quad \text{[Math. 4]}$$

$$rank1(B, i) - rank1(B, j-1) = \begin{cases} k & \text{if } i-j \geq k \\ i-j & \text{otherwise} \end{cases} \quad \text{[Math. 5]}$$

$$rank0(B, i) = i \cdot rank1(B, i) \quad \text{[Math. 6]}$$

When a bit stream B is represented by a bit stream B1 and a bit stream Br1, select1(B, i) can be calculated by Math. 7 below. Note that r is defined as r=rank1(Br1, i+1). That is, r indicates that a run when the total of the lengths of runs reaches i+1 is the r-th run when adding up the lengths of runs from the beginning.

$$select1(B,i)=select1(B,r-1)+i+1-select1(B^{r1},r-1)-1 \quad \text{[Math. 7]}$$

That is, it is obtained that the sought (i+1)th 1 is in the run. In the above-described Math. 7, select1(B1, r) represents the start position of the run, and i+1−select1(Br1, r) represents what numbered 1 in the run is the (i+1)th 1 in the whole bit stream B. Adding up the values and subtracting 1 therefrom yields the position of the (i+1)th 1.

Calculations in the respective operations when the bit stream B is "001110011011" will now be described specifically. In this case, the bit stream B1 becomes "0010000100101" and the bit stream Br1 becomes "10010101". It is assumed that rank1(B, i) where i=8, that is, rank1(B,8), is to be calculated in this case.

The number of runs that start at positions anterior to the position i is r=rank1(B1,8)=2. The start position of the second run is j=select1(B1,2−1)=7. In this case, the number of 1s in the interval [0, j−1] is equal to the total of the length of a run and can be calculated as select1(Br1,1)=3. Next, when the length of the second run is denoted by k, since r=2 in the above-described Math. 4, k is calculated as k=select1(Br1,2)−select1(Br1,2−1)=5−3=2. Since i−j=8−7=1<k, it is obtained that that one (i−j=1) 1 exists in the interval [i, j). Therefore, the sought solution is obtained as rank1(B,8)=3+1=4.

As another example, a case of calculating rank1(B, i) where i=10, that is, rank1(B,10), will also be described. Although k=2 is also obtained in this case, i−j=10−7=3>k holds, differing from the above-described case. Therefore, the sought solution is obtained as rank1(B,10)=3+2=5.

It is assumed that select1(B, i) where i=4, that is, select1(B,4), is to be calculated in the above-described case. In this case, the number of runs that start at positions anterior to the position i is r=rank1(Br1,4+1)=2. Thus, it results that a sought position is in the second run. The start position of the second run is select1(B1,2−1)=7. Furthermore, the sought (i+1)th 1 is the second 1 in the run since 4+1−select1(Br1, 2−1)=4+1−3=2. From 7+2−1=8, it is obtained that the sought (i+1)th 1 is positioned at B[8].

As described above, a fully indexable dictionary may be represented by sparse bit streams. The size of the fully indexable dictionary of a bit stream B is now considered. The size of the fully indexable dictionary of a bit stream B is the sum of the size of a bit stream B1 and the size of a bit stream Br1. The size of the fully indexable dictionary of a sparse bit stream becomes m log(n/m)+2m+o(m) bits, when the length of a bit stream is denoted by n and the number of included 1s is denoted by m.

Thus, when the number of runs included in a bit stream is denoted by b, applying the expression to B1 and Br1 yields a result that the size of the bit stream B1 is b log(n/b)+2b+o(b) bits because the bit stream has a length of n and includes b number of 1s. In a similar manner, since the bit stream Br1 has a length of m and includes b number of 1s, the size of the bit stream Br1 becomes b log(m/b)+2b+o(b) bits. Therefore, adding these two sizes together yields the size of the fully indexable dictionary of the bit stream B. That is, the size of the fully indexable dictionary of the bit stream B becomes b(log(n/b)+log(m/b)+4)+o(b) bits.

CITATION LIST

Non Patent Literature

[NPL 1] D. Okanohara, "High-speed string analysis, data compression/full-text search/text mining (Series in Science of Probability and Informatics)" (in Japanese, Kosoku Mojiretsu Kaiseki no Sekai, Data Assyuku/Zenbun Kensaku/Text Mining (Series Kakuritsu to Jouhou no Kagaku)), Iwanami Shoten, Dec. 27, 2012

[NPL 2] V. Makinen, G. Navarro, J. Siren, and N. Valimaki. Storage and retrieval of highly repetitive sequence collections. J. Comp. Biol., 17(3):281-308, 2010.

[NPL 3] A. Gupta, W.-K. Hon, R. Shah, and J. S. Vitter. Compressed data structures: Dictionaries and data-aware measures. In Proc. 16th Data Compression Conference (DCC), pages 213-222, 2006.

SUMMARY OF INVENTION

Technical Problem

As described above, when the method disclosed in the above-described NPL 2 is used, only preparing two sparse bit streams enables run-length compression to be applied to a bit stream including successions of 1s and 0s, and rank1, rank0 and select1 to be calculated efficiently.

However, in the method disclosed in NPL 2, there is a problem in that select0 cannot be calculated efficiently. That is because in the method, while a bit stream holding values of rank1 required for efficient calculation of select1 is used, a bit stream holding values of rank0 required for efficient calculation of select0 is not used.

On the other hand, it is conceivable that holding a bit stream required for efficient calculation of select0, in addition to the above-described bit stream (bit stream Br1) required for efficient calculation of select1, enables select0 to be calculated efficiently.

However, employing the above method leads to addition of a fully indexable dictionary with a size of b(log(m/b)+2b+o(b) bits and increases the size of the whole from b(log(n/b)+log(m/b)+4)+o(b) bits to b(log(n/b)+2 log(m/b)+6)+o(b) bits. In other words, when m is close to n, a value of log(n/b) and a value of log(m/b) are substantially the same because both are logarithmic values, and when the substantially same value is denoted by C, the size increases from 2b(C+2)+o(b) bits to 3b(C+2)+o(b) bits, which is approximately 1.5 times increase in size. The increase becomes a non-negligible increase in size when implementing a fully indexable dictionary.

Both select1 and select0 are used in various data structures. For example, in a data structure of a tree structure type that is referred to as a wavelet tree, both select1 and select0 of a fully indexable dictionary are called when the tree structure is traversed upward. Therefore, in various data structures, a fully indexable dictionary that allows calculation of both select1 and select0 and has a small size is demanded.

An example of an object of the present invention is to provide a data structure, an information processing device, an information processing method, and a program recording medium that solve the above-described problems and enable an increase in the size of a fully indexable dictionary to be suppressed while enabling a target bit stream to be subjected to two types of selection operations employing the fully indexable dictionary.

Solution to Problem

To achieve the above-described object, an information processing device in one aspect of the present invention includes a storage unit for storing a data structure representing a bit stream composed of a first value and a second value, wherein the data structure includes first data specifying positions of all or some of succession segments, each of the succession segments including a succession of one or more the first values or the second values on the bit stream, second data specifying appearance count of the first value appeared on the bit stream from the beginning of the bit stream to the succession segment for each of some of the succession segments, and third data specifying appearance count of the second value appeared in the bit stream from the beginning of the bit stream to the succession segment for each of some of the succession segments.

To achieve the above-described object, a data structure in one aspect of the present invention includes first data specifying positions of all or some of succession segments, each of the succession segments including a succession of one or more identical values on the bit stream, second data specifying appearance count of a first value appeared in the bit stream from the beginning of the bit stream to the succession segment for each of some of the succession segments, and third data specifying appearance count of a second value appeared on the bit stream from the beginning of the bit stream to the succession segment for each of some of the succession segments.

To achieve the above-described object, an information processing method in one aspect of the present invention includes first data specifying positions of all or some of succession segments each of which includes a succession of one or more first values or second values on a bit stream formed using the first value and the second value, second data specifying appearance count of the first value appeared in the bit stream from the beginning of the bit stream to the succession segment for each of some of the succession segments, and third data specifying appearance count of a second value appeared on the bit stream from the beginning of the bit stream to the succession segment for each of some of the succession segments the method including: a step (a) of specifying a first select position using the first data, the second data and the third data when a natural number is input, the first select position being a position on the bit stream and the first values count included in an interval from the beginning to the position coinciding with the natural number at the first select position; and a step (b) of specifying a second select position using the first data, the second data and the third data when the natural number is input, the second select position being a position on the bit stream and the second values count included in an interval from the beginning to the position coincides with the natural number at the second select position.

Further, to achieve the above-described object, a program recording medium in one aspect of the present invention makes a computer execute a step (a) of storing, into a storage device included in the computer, a data structure including first data specifying positions, on a bit stream formed using a first value and a second value, of all or some of succession segments each of which includes a succession of one or more the first values or the second values; second data specifying, for each of some of the succession segments, appearance count of a first value appeared on the bit stream from the beginning of the bit stream to the succession segment; and third data specifying, for each of some of the succession segments, appearance count of a second value appeared on the bit stream from the beginning of the bit stream to the succession segment, a step (b) of specifying a first select position using the first data, the second data and the third data when a natural number is input, the first select position being a position on the bit stream and the first values count included in an interval from the beginning to the position coinciding with the natural number at the first select position, and a step (c) of, specifying a second select position using the first data, the second data and the third data when a natural number is input, the second select position being a position on the bit stream and the second values count included in an interval from the beginning to the position coinciding with the natural number at the second select position.

Advantageous Effects of Invention

As described above, according to the present invention, an increase in the size of a fully indexable dictionary is suppressed while enabling two types of selection operations employing the fully indexable dictionary for a target bit stream.

BRIEF DESCRIPTION OF DRAWINGS

FIG. 3 is a diagram illustrating an example of a target bit stream and various types of values that are calculated therefrom;

FIG. 4 is a diagram illustrating an example of a data structure for representing the bit stream illustrated in FIG. 3;

FIG. 5 is a flow diagram illustrating an operation of the information processing device in the exemplary embodiment of the present invention;

FIG. 6 is a block diagram illustrating an example of a computer for achieving the information processing device in the exemplary embodiment of the present invention; and FIG. 7 is a diagram schematically describing a calculation method of select1(B, i) in an example of the present invention.

Figure 1:
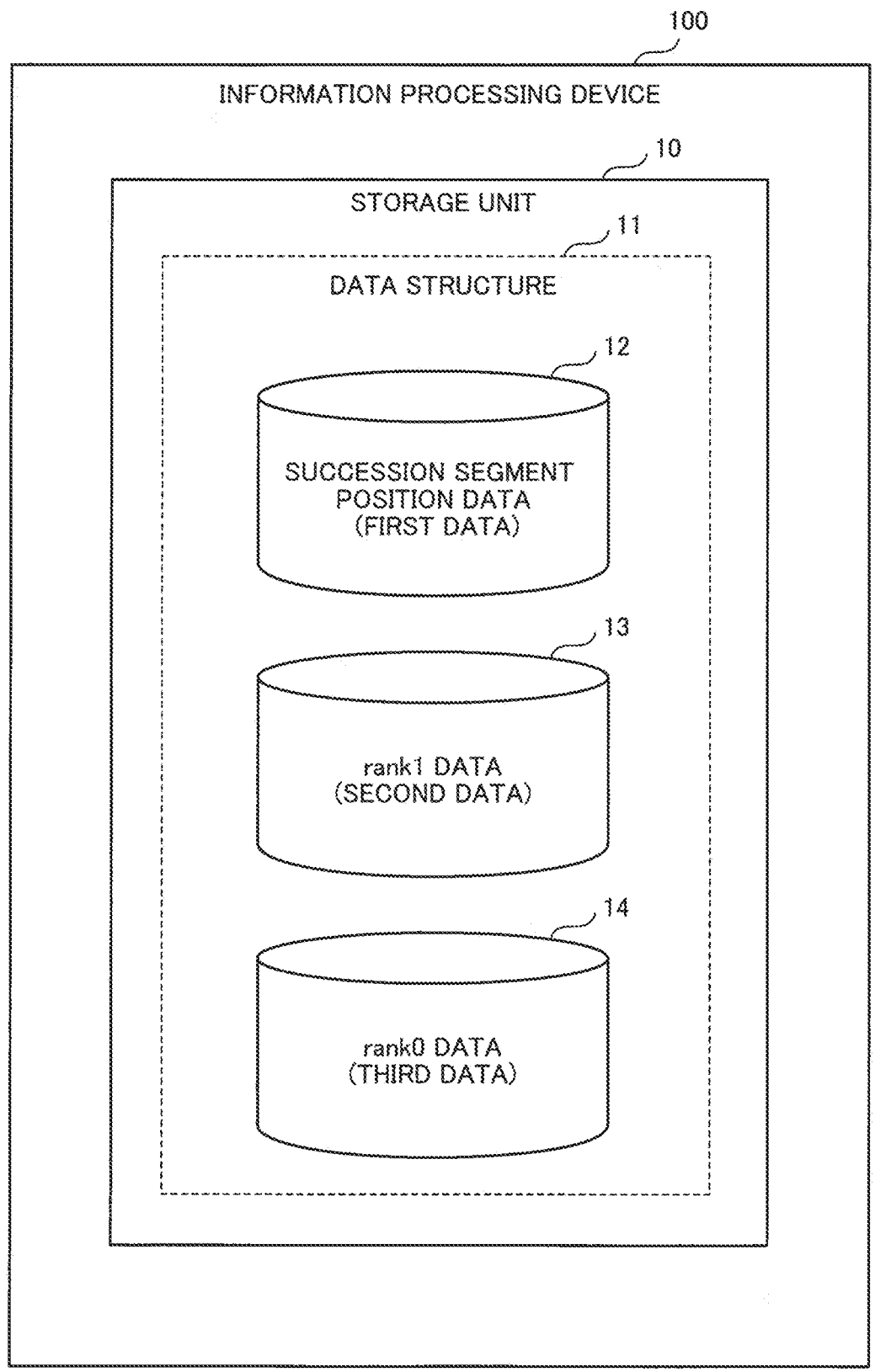
FIG. 1 is a block diagram illustrating a schematic configuration of an information processing device in an exemplary embodiment of the present invention.

DESCRIPTION OF EMBODIMENTS (Data Processing in Information Processing Device of this Exemplary Embodiment of Invention)

First, an outline of the present invention will be described. In the description, a value of rank1(B, sa) and a value of rank0(B, sa) at the start position sa of an a-th run are denoted by rank1 and rank0 of the run, respectively.

First, for each of all runs, it will be shown that when three values <start position, rank1, rank0> of the run are stored, sufficient information for restoring an original bit stream B is obtained because it is possible to restore the original bit stream B, if only these three values are available. Therefore, the theorem below holds.

Theorem:

For an arbitrary a-th run in a bit stream B, let sa denote the start position of the a-th run, and let sa+1 denote the start position of the (a+1)th run. Then, if only four values including sa, rank0(B, sa), sa+1 and rank1(B, sa+1) are obtained, it is possible to specify whether every bit in the interval B[sa, sa+1) is 1 or 0.

(Proof)

It is assumed that a position at which the a-th run ends and turns to 0 is denoted by ea. Then, from the definition of a run, all the bits in the interval B[sa, ea) are 1, and all the bits in the interval B[ea, sa+1) are 0. In this case, a value of ea can be calculated by Math. 8 below. In the mathematical formulae in the description, ea is expressed as $e_a$.

$$e_a = \text{rank0}(B, e_a) + \text{rank1}(B, e_a) = \text{rank0}(B, s_a) + \text{rank1}(B, s_{a+1}) \quad [\text{Math. 8}]$$

In the above-described proof, the following fact is used. That is, since only is exist in the interval [sa, ea), rank0(B, ea)=rank0(B, sa) holds. Similarly, since only 0s exist in the interval [ea, sa+1), rank1(B, ea)=rank1(B, sa+1) holds. Since ea can be calculated specifically, all the bits in B[sa, sa+1) are specified. (Q.E.D.)

The above-described theorem shows that, if values of <start position, rank1, rank0> are obtained for each of two succeeding runs, it is possible to restore an area sandwiched between the start positions of the two runs completely.

If the feature is applied to all the combinations of succeeding runs, it results that, when three values <start position, rank1, rank0> are stored for every run, it is possible to restore the original bit stream B if only the three values are available.

In the exemplary embodiment of the present invention, attention is now given to a feature that if only two values out of three values <start position, rank1, rank0> are known, it is further possible to calculate the other value dynamically. That is because relation expressed by Math. 9 below always holds for an arbitrary start position i.

$$i = \text{rank1}(B,i) + \text{rank0}(B,i) \quad \text{[Math. 9]}$$

Due to this feature, it results that it is possible to restore the original bit stream B, if only two values out of three values <start position, rank1, rank0> are known for every run.

When considered from such a point of view, the method disclosed in NPL 2 corresponds to a case in which two types of values <start position, rank1> are always stored for all the runs. Therefore, in the method disclosed in NPL 2, it is possible to calculate select1 with high speed because only a bit stream of rank1 values is held. However, in the method disclosed in NPL 2, since a bit stream of rank0 values is not held, a problem is caused in that it is impossible to calculate select0 with high speed.

It is also conceivable that the method described in NPL 2 is extended in such a way that all the three types of values <start position, rank1, rank0> are simply stored. In this case, however, although it becomes possible to solve the above-described problem, required data size increases to approximately 1.5 times a data size in a case in which two types of values <start position, rank1> are stored, as described in the section "Technical Problem".

For this reason, an information processing device in the exemplary embodiment of the present invention may select different two types of values and store the selected two types of values with respect to each run, instead of always storing the same two types of values as in the method disclosed in NPL 2.

That is, in the present invention, with respect to each of all the runs, only two values out of three values <start position, rank1, rank0> may be selected, and the selected values may be stored. Further, at each position, two values to be stored may be changed. For example, for a run, only two values <start position, rank1> may be stored, and, for another run, two values <start position, rank0> may be stored. Such a configuration brings about a state in which no value of rank0 is stored for a run, while no value of rank1 is stored for another run. This means performing sampling for some runs and storing only sampled values, instead of storing rank1 values and rank0 values for all the runs.

In this case, since only two values out of three values <start position, rank1, rank0> are stored, the information processing device may reduce required data size to approximately two thirds of a data size in comparison with a case where all three values <start position, rank1, rank0> are stored, and may save a storage area. As described above, the information processing device may dynamically calculate a value among three values based on the other two values.

When the start positions of runs are put into an array, the array becomes a monotonically increasing array with respect to all runs, and, in a similar manner, rank1 values and rank0 values also constitute monotonically increasing arrays. Thus, using the fully indexable dictionary of a sparse bit stream enables efficient search for values of a start position, rank1 and rank0.

An advantage that the exemplary embodiment of the present invention has over the method described in NPL 2 is storing rank1 values on occasions and storing rank0 values on other occasions depending on runs, instead of storing rank1 values for all of the start positions. The operation as above brings the information processing device to a state in which the information processing device is sampling values of rank1 and values of rank0 at various positions in the whole bit stream. When the information processing device calculates select1, the information processing device may obtain an approximate positional estimate by searching the sampled values of rank1. When the information processing device calculates select0, the information processing device may obtain an approximate positional estimate by searching the sampled values of rank0. After obtaining the approximate positional estimate, the information processing device dynamically calculates values of rank1 or values of rank0 for runs in the vicinity of the estimated position to obtain an accurate position.

Specifically, when the information processing device calculates select1(B, i), the information processing device first specifies a run that has a value of rank1 close to i out of runs the values of rank1 of which are stored. Next, using the run as a foothold, the information processing device, for runs that are positioned in the vicinity of the run and that have no rank1 values stored, calculates values of rank1 up to the run dynamically. The value of rank1 of such a run can be dynamically calculated based on the other two values, that is, the start position and rank0 value of the run. In this way, the information processing device may calculate a position at which the i-th 1 actually appears, by restoring the values of rank1 of adjacent runs.

When the information processing device calculates select0(B, i) the information processing device conversely may specify a run that has a value of rank0 close to i out of runs the values of rank0 of which are stored and, for runs that are positioned in the vicinity of the run and that have no values of rank0 stored, dynamically calculate values of rank0.

Although the way of selection of two types out of the three types and storing them is not limited specifically, the selection methods include various ways. For example, the information processing device may store two types of values out of the three types of values in rotation for each run. That is, a method is conceivable in which two values other than the start position are stored in the first run, two values other than rank1 are stored in the second run, two values other than rank0 are stored in the third run, and, in the fourth run, returning to the beginning, two values other than the start position are stored.

The selection methods also include a method in which two values <start position, rank1> are stored for even-numbered runs, and two values <start position, rank0> are held for odd-numbered runs. In this case, although values of rank0 at the start positions of even-numbered runs and values of rank1 at the start positions of odd-numbered runs are not held, the information processing device may calculate these values dynamically.

EXEMPLARY EMBODIMENT

Hereinafter, a data structure, an information processing device, an information processing method and a program in an exemplary embodiment of the present invention will be described with reference to FIGS. 1 to 6.

[Device Configuration]

First, a configuration of the information processing device in the exemplary embodiment will be described. FIG. 1 is a block diagram illustrating a schematic configuration of the information processing device in the exemplary embodiment of the present invention.

As illustrated in FIG. 1, an information processing device 100 in the exemplary embodiment includes a storage unit 10 that has stored a data structure 11. The data structure 11 is a data structure used to represent a bit stream formed of a first value and a second value and has first data 12, second data 13 and third data 14.

Among the data, the first data are data that specify the positions of all or part of succession segments each of which includes a succession of one or more the first values or the second values in the bit stream. The second data are data that specify, for part of the succession segments, the number of appearances of the first value that has appeared in the bit stream from the beginning of the bit stream to the succession segment. The third data are data that specify, for part of the succession segments, the number of appearances of the second value that has appeared in the bit stream from the beginning of the bit stream to the succession segment.

In the exemplary embodiment, it is assumed that the first value is "1", the second value is "0" and the succession segments in which the first data specifies the position are succession segments of "1"s. In this case, the first data are data that specify the start positions of runs (hereinafter referred to as "succession segment position data"). The second data are data that specify the numbers of appearances of "1" in intervals to corresponding succession segments, that is, values of rank1 (hereinafter referred to as "rank1 data"). Further, the third data are data that specify the numbers of appearances of "0" in intervals to corresponding succession segments, that is, values of rank0 (hereinafter referred to as "rank0 data").

In other words, in the exemplary embodiment, any one out of the three values <start position, rank1, rank0> is stored for all or part of the succession segments in the storage unit 10. Therefore, it becomes possible to perform two types of selection operations for a target bit stream. Since it is not required to store all three values for all the succession segments, an increase in the size of a fully indexable dictionary (the data structure 11) is suppressed.

Figure 2:
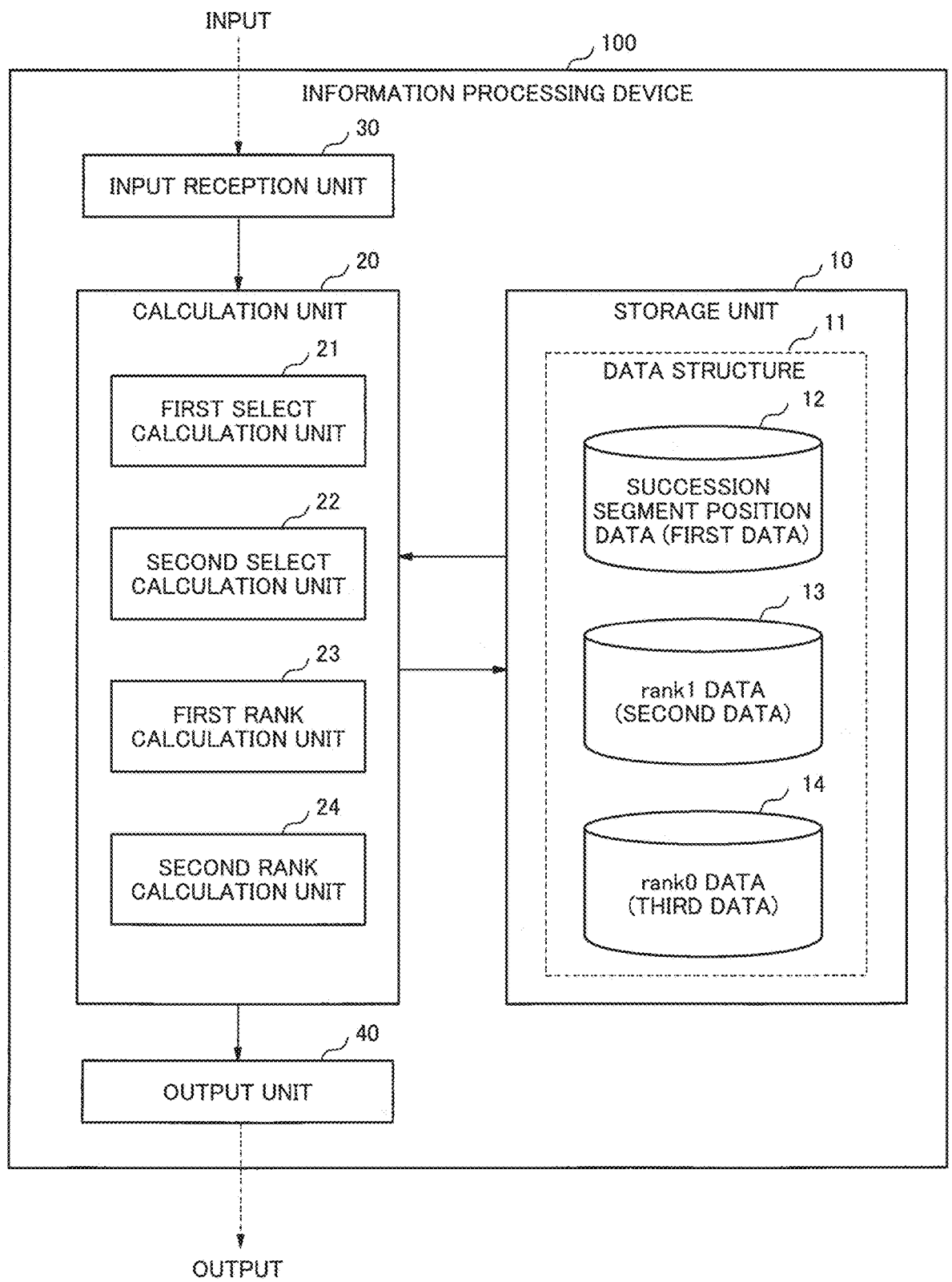
FIG. 2 is a block diagram specifically illustrating a configuration of an information processing device 100 in the exemplary embodiment of the present invention.

Subsequently, the configuration of the information processing device 100 in the exemplary embodiment will be described further specifically using FIG. 2. FIG. 2 is a block diagram specifically illustrating the configuration of the information processing device 100 in the exemplary embodiment of the present invention.

As illustrated in FIG. 2, the information processing device 100 in the exemplary embodiment includes a calculation unit 20, an input reception unit 30 and an output unit 40, in addition to the above-described storage unit 10 storing the data structure 11. In the exemplary embodiment, the information processing device 100 is, for example, constructed by implementing a program, which will be described later, into a computer. In this case, the information processing device 100 may function as a portion of an operating system that composes the computer.

Among the components, the input reception unit 30 receives input from the outside and outputs the received input to the calculation unit 20. The output unit 40 outputs a result of calculation performed by the calculation unit 20 to the outside. The calculation unit 20 includes a first select calculation unit 21, a second select calculation unit 22, a first rank calculation unit 23 and a second rank calculation unit 24.

In the calculation unit 20, the first select calculation unit 21 specifies, when a natural number is input, a first select position that is a position in a bit stream and at which the number of "1 (first value)" included in an interval from the beginning to the position coincides with the natural number. The first select calculation unit 21 specifies the first select position using the succession segment position data, the rank1 data and the rank0 data. That is, the first select calculation unit 21 executes select1(B, i) against a bit stream B.

The second select calculation unit 22 specifies, when a natural number is input, a second select position that is a position in a bit stream and at which the number of "0 (second value)" included in an interval from the beginning to the position coincides with the natural number, using the succession segment position data, the rank1 data and the rank0 data. That is, the second select calculation unit 21 executes select0(B, i) against a bit stream B.

The first rank calculation unit 23 specifies, when a position in a bit stream is designated, the number of appearances of "1 (first value)" that has appeared in an interval to the designated position, using the succession segment position data, the rank1 data and the rank0 data. That is, the first rank calculation unit 23 executes rank1(B, i) against a bit stream B. Further, the second rank calculation unit 24 specifies, when a position in a bit stream is designated, the number of appearances of "0 (second value)" that has appeared in an interval to the designated position, using the succession segment position data, the rank1 data and the rank0 data. That is, the second rank calculation unit 24 executes rank0(B, i) against a bit stream B.

Using FIGS. 3 and 4, a data structure used in the exemplary embodiment will now further specifically be described. FIG. 3 is a diagram illustrating an example of a target bit stream and various types of values that are calculated therefrom. FIG. 4 is a diagram illustrating an example of a data structure for representing the bit stream illustrated in FIG. 3.

In the example in FIG. 3, a bit stream B as data is [001110011011] and has three succession segments (runs) of 1s. The start positions of the respective runs are 2, 7 and 10. In the row labeled as "start position", appearance orders are stated in the fields corresponding to the start positions. Each entry in the row labeled as "pos1" represents a position. In the description, although the index of an array containing a bit stream B starts from 0, it is assumed that the 0-th run does not exist because the orders of runs are counted from the first.

In FIG. 3, each entry in the row labeled as "rank1" indicates the number of appearances of "1" in the bit stream B from the beginning to the position of the entry, that is, a value of rank1. Each entry in the row labeled as "rank0" indicates the number of appearances of "0" in the bit stream B from the beginning to the position of the entry, that is, a value of rank0. Each entry in the row labeled as "select1" indicates an input value i, the position of which is returned as a result of select1(B, i). Each entry in the row labeled as "select0" indicates an input value i, the position of which is returned as a result of Select0(B, i).

As illustrated in FIG. 4, in the exemplary embodiment, the succession segment position data are data that are obtained by converting data in the row labeled as "start position" in FIG. 3 into a bit stream. The rank1 data are data that are obtained by converting data at start positions in the row labeled as "rank1" in FIG. 3 into a bit stream. The rank0 data are data that are obtained by converting data at start positions in the row labeled as "rank0" in FIG. 3 into a bit stream. Note that the bit stream composing the succession segment position data is denoted by "B1", the bit stream composing the rank1 data is denoted by "Br1" and the bit stream composing the rank0 data is denoted by "Br0".

However, if the information processing device 100 converts data of the start positions of all the succession segments in the rows labeled as "rank1" and "rank0" into bit streams, the data amount of the data structure 11 increases. Due to the situation, in the exemplary embodiment, the data structure 11 is constructed so that, for each succession segment, at least two values out of three values including a start position, rank1 and rank0 are specified using the succession segment position data, the rank1 data and the rank0 data. In this case, the at least two values to be specified will vary depending on the positions (start positions) of succession segments.

Specifically, the succession segment position data in the example in FIG. 4 specify the positions of all the succession segments each of which includes a succession of one or more "1"s in the bit stream B. A succession segment for which the rank1 data specify the number of appearances of "1" coincides with a succession segment that appears in an even-numbered place. On the other hand, a succession segment for which the rank0 data specify the number of appearances of "0" is assumed to coincide with a succession segment that appears in an odd-numbered place.

In the exemplary embodiment, the data structure 11 is not limited to the example illustrated in FIG. 4. For example, the data structure may be constructed so that a value of rank1 and a value of rank0 are specified for the first succession segment, a start position and a value of rank0 are specified for the second succession segment, a start position and a value of rank1 are specified for the third succession segment, and these specifications are repeated thereafter.

When the data structure 11 is the data structure illustrated in FIG. 4, the first select calculation unit 21 and the second select calculation unit 22 calculates in the following manner. First, based on the numbers of appearances of "1" which the rank1 data specify, the first select calculation unit 21 estimates a succession segment for which the number of appearances of "1" is specified in the rank1 data and which a select1 value to be subjected to specification exists in or exists close to.

Next, for a succession segment that exists close to the estimated succession segment and for which the number of appearances of a "1" is not specified in the rank1 data, the first select calculation unit 21 specifies the number of appearances of "1", based on the succession segment position data and the rank0 data. The first select calculation unit 21 specifies the select1 value using the specified number of appearances of "1".

In addition, based on the numbers of appearances of a "0", which the rank0 data specify, the second select calculation unit 22 first estimates a succession segment, out of the succession segments, for which the number of appearances of "0" is specified in the rank0 data and which a select0 value to be subjected to specification exists in or exists close to.

Next, for a succession segment that exists close to the estimated succession segment and for which the number of appearances of "0" is not specified in the rank0 data, the second select calculation unit 22, specifies the number of appearances of "0" based on the succession segment position data and the rank1 data. The second select calculation unit 22 specifies a select0 value using the specified number of appearances of a "0".

In the exemplary embodiment, it is preferable that the data structure 11 be compressed by regarding each of positions specified by the succession segment position data, the numbers of appearances of "1" specified by the rank1 data and the numbers of appearances of "0" specified by the rank0 data as a monotonically increasing sequence. In this case, the data structure 11 is stored in the storage unit 10 while being compressed.

[Device Operation]

Next, an operation of the information processing device 100 in the exemplary embodiment of the present invention will be described using FIG. 5. FIG. 5 is a flow diagram illustrating an operation of the information processing device in the exemplary embodiment of the present invention. In the following description, FIG. 1 will be appropriately referenced. In the exemplary embodiment, operating the information processing device 100 causes an information processing method to be performed. Thus, a description of an information processing method in the exemplary embodiment will be represented by the following description of an operation of the information processing device 100.

As illustrated in FIG. 5, first, the input reception unit 30 receives input of a natural number and input of a requested operation from the outside (step A1) and outputs the received input to the calculation unit 20.

Next, the calculation unit 20 determines whether or not the requested operation is select1 (step A2). When the results of determination in step A2 indicates that the requested operation is select1, the first select calculation unit 21 obtains the succession segment position data 11, the rank1 data 12 and the rank0 data 13 from the storage unit 10. The first select calculation unit 21 calculates a select1 value for the natural number received in step A1 using these data (step A3).

When the results of determination in step A2 indicates that the requested operation is not select1, the calculation unit 20 determines whether or not the requested operation is select0 (step A4). When the results of determination in step A4 indicates that the requested operation is select0, the second select calculation unit 22 obtains the succession segment position data 11, the rank1 data 12 and the rank0 data 13 from the storage unit 10. The second select calculation unit 22 calculates a select0 value for the natural number received in step A1 using these data (step A6).

When the results of determination in step A4 results that the requested operation is not select0, the calculation unit 20 determines whether or not the requested operation is rank1 (step A5). When the results of determination in step A5 indicates that the requested operation is rank1, the first rank calculation unit 23 obtains the succession segment position data 11, the rank1 data 12 and the rank0 data 13 from the storage unit 10. The first rank calculation unit 23 calculates a rank1 value for the natural number received in step A1 using these data (step A7).

On the other hand, when the results of determination in step A5 indicates that the requested operation is not rank1, the second rank calculation unit 24 obtains the succession segment position data 11, the rank1 data 12, and the rank0 data 13 from the storage unit 10. The second rank calculation unit 24 calculates a rank0 value for the natural number received in step A1 using these data (step A8).

As the above-described step A3, A6, A7 or A8 is executed, the output unit 40 receives a calculation result and outputs the calculation result to the outside (step A9). As described above, execution of steps A1 to A9 enables the operations of select1, select0, rank1 and rank0 to be performed using the data structure 11.

Advantageous Effects of Exemplary Embodiment

Subsequently, advantageous effects of the exemplary embodiment will be described. As illustrated in FIG. 4, in the exemplary embodiment, three sparse bit streams B1, Br1 and Br0 are prepared as the data structure 11 with respect to a bit stream B. The bit stream B1 is a sparse bit stream in which 1 appears only at the start positions of runs.

The bit stream Br1 is a bit stream that stores values of rank1 at the start positions of even-numbered runs. That is, Br1[rank1(B, i)]=1 is set for the start position i of each even-numbered run, and 0 is set to the other elements. The length of the bit stream corresponds with the m number of "1" included in the bit stream B. In the bit stream, b/2 number of "1" are included.

In a similar manner, Br0 is defined. That is, Br0[rank0(B, i)]=1 is set for the start position i of each odd-numbered run, and "0" is set to the other elements. The length of the bit stream coincides with the number (n−m) of "0"s included in B. In the bit stream, b/2 number of "1" are included.

In the exemplary embodiment, the size of the data structure 11, that is, the size of the fully indexable dictionary, is equal to the total of the sizes of the fully indexable dictionaries of respective three bit streams, namely the sparse bit stream B1, the bit stream Br1, and the bit stream Br0. Specifically, since the bit stream B1 has a length of n and includes b number of 1s, the size of the fully indexable dictionary of the bit stream B1 is b log(n/b)+2b+o(b) bits. Since the bit stream Br1 has a length of m and includes b/2 number of 1s, the size of the fully indexable dictionary of the bit stream Br1 is (b/2)log(2m/b)+2(b/2)+o(b) bits. Since the bit stream Br0 has a length of (n−m) and includes b/2 number of 1s, the size of the fully indexable dictionary of the bit stream Br0 is (b/2)log(2(n−m)/b)+2(b/2)+o(b) bits. Therefore, these sizes add up to the total size S of the fully indexable dictionary (the data structure 11) as expressed by Math. 10 below.

$$S = \{b \log(n/b) + (b/2)\log(2m/b) + (b/2)\log(2(n-m)/b) + 4b + o(b)\} \text{ [bit]} \quad \text{[Math. 10]}$$

It may be regarded that log(n/b), log(2m/b) and log(2(n−m)/b) are substantially the same size as one another. For example, when m=n/2, that is, when a half of the bits in a bit stream of length n are occupied by "1"s and the other half are occupied by "0"s, the above quantities are equal to log(n/b). When these values are represented by C, the size of the fully indexable dictionary in the exemplary embodiment becomes 2b(C+2)+o(b) bits. This means that, while having substantially the same size as the fully indexable dictionary disclosed in NPL 2 which only supports select1, the fully indexable dictionary in the exemplary embodiment is capable of supporting both operations select1 and select0. Furthermore, this means that the size of the fully indexable dictionary in the exemplary embodiment becomes approximately two thirds of the size of a fully indexable dictionary disclosed in NPL 2 that is made capable of supporting both select1 and select0. That is, according to the exemplary embodiment while enabling a function of supporting both operations select1 and select0 to be provided to a fully indexable dictionary, the size of the fully indexable dictionary can be reduced to approximately two thirds of a conventional fully indexable dictionary.

Modified Exemplary Embodiments

In the above-described example, the first value is "1", the second value is "0", and the succession segments which the first data specifies the position are succession segments of "1". However, the exemplary embodiment is not limited to the example. Since 1 and 0 in a bit stream are interchangeable, by interchanging 1 and 0, the first value may be set to "0", the second value may be set to "1", and the succession segments in which the position are specified by the first data may be set to and succession segments of "0"s. Even this case may provide exactly the same advantageous effects as the above-described advantageous effects.

In the example in FIG. 4, the succession segment position data hold the start positions of succession segments. However, the forward direction and the backward direction are interchangeable in the exemplary embodiment, and the succession segment position data may hold the end positions, in place of the start positions, of succession segments. Even this case may provide the same advantageous effects. Moreover, although in the example in FIG. 4, rank1 is held for even-numbered runs and rank0 is held for odd-numbered runs, the relation between odd-numbered runs and even-numbered runs is changeable in an opposite manner in the exemplary embodiment, and even this case may provide the same advantageous effects.

[Program]

A program in the exemplary embodiment may be a program that causes a computer to execute steps A1 to A9 illustrated in FIG. 5. Installing the program in the computer and executing the program enables the information processing device 100 and the information processing method in the exemplary embodiment to be achieved. In this case, a CPU (Central Processing Unit) included in the computer functions as the input reception unit 30, the calculation unit 20, and the output unit 40 and performs processing. The storage unit 10 is achieved by storing data files constituting the data structures into a storage device, such as a memory, a hard disk or the like with which the computer is provided.

The computer that achieves the information processing device 100 by executing the program in the exemplary embodiment will now be described using FIG. 6. FIG. 6 is a block diagram illustrating an example of the computer that achieves the information processing device in the exemplary embodiment of the present invention.

As illustrated in FIG. 6, a computer 110 includes a CPU 111, a main memory 112, a storage device 113, an input interface 114, a display controller 115, a data reader/writer 116, and a communication interface 117. These respective components are interconnected by way of a bus 121 in a data communicable manner with one another.

The CPU 111 executes various operations by deploying the program (code) in the exemplary embodiment which is stored in the storage device 113 on the main memory 112 and executing the deployed program in a predetermined order. The main memory 112 is typically a volatile storage device, such as a DRAM (Dynamic Random Access Memory). The program in the exemplary embodiment is provided while being stored in a computer-readable recording medium 120. The program in the exemplary embodiment may be a program distributed on the Internet to which the computer 110 is connected via the communication interface 117.

Specific examples of the storage device 113 include a semiconductor storage device such as a flash memory, in addition to the hard disk. The input interface 114 mediates data transmission between the CPU 111 and an input device 118, such as a keyboard and a mouse. The display controller 115 is connected to a display device 119 and controls display on the display device 119.

The data reader/writer 116 mediates data transmission between the CPU 111 and the recording medium 120 and executes reading of the program from the recording medium 120 and writing of a result of processing in the computer 110 into the recording medium 120. The communication interface 117 mediates data transmission between the CPU 111 and another computer.

Specific examples of the recording medium 120 include a general-purpose semiconductor storage device such as a CF (Compact Flash) and an SD (Secure Digital), a magnetic storage medium such as a flexible disk, and an optical storage device such as a CD-ROM (Compact Disk Read Only Memory).

Example 1

A specific example of the information processing device of the exemplary embodiment illustrated in FIGS. 1 to 6 will now be described below.

The following description will be made mainly on a feature that the data structure (fully indexable dictionary) in the exemplary embodiment is usable as a fully indexable dictionary, that is, access, rank and select are operable.

In the following description, as a measure for simplifying calculation, it is assumed that, when a bit array B of length n is given, an imaginary run is supposed to starts from an (n+1)th element B[n], and B[n] is recorded as the start position of the imaginary run. This assumption is made so as not to execute exception handling in calculation processing of rank and select, which will be described later.

In calculation processing described later, processing of calculating the start positions of the a-th run and the (a+1)th run is performed repeatedly. Assuming that a new run starts from B[n] and registering B[n] enable exception handling for a case in which the (a+1)th run does not exist to be avoided from being performed. Note that assuming such an imaginary run increases the number of runs by one. Since the increased virtual run is so small as to be negligible from an overall perspective of the array, the virtual run is excluded from calculation of the size of a fully indexable dictionary.

The bit stream B illustrated in FIG. 3 is now considered. The bit stream B illustrated in FIG. 3 is a bit stream with a length of 12, and is made up of seven 1s and five 0s. The start positions of runs in the bit stream B are four positions, namely B[2], B[7], B[10] and B[12]. The run starting from B[12] is, however, an virtual run that does not exist in the actual bit stream B.

For the bit stream B, access(B, i) and rank1(B, i) are calculated by the calculation unit 20 through substantially the same operations, as will be described below. First, using a=rank1(B1, i+1), the number a of start positions of runs included in B[0, i] is obtained (see FIG. 4).

When a=0, both access(B, i) and rank1(B, i) have a value of 0, and the calculation by the calculation unit 20 is thus finished. On the other hand, when a>0, the calculation unit 20 focuses on the a-th run. A position i given as an argument is located either on the a-th run or on the space between the a-th run and the (a+1)th run. If relative positional relations between the position i and these runs are obtained, the calculation unit 20 may calculate a value of access and a value of rank1.

It is assumed that the start position of the a-th run is denoted by sa, the position at which the a-th run ends and turns to 0 is denoted by ea, and the start position of the (a+1)th run is denoted by sa+1. Under the assumption, sa≤i<sa+1 and sa<ea≤sa+1 always hold. The whole of the interval B[sa, ea) is occupied by 1, and the whole of the interval B[ea, sa+1) is occupied by 0.

In the above-described case, if i<ea, the position i is located on the a-th run. That is, access(B, i)=B[i]=1. On the other hand, if ea≤i, the position i is located between the a-th run and the (a+1)th run. That is, access(B, i)=B[i]=0.

Cases in which a is an odd number and a is an even number will now be considered separately. If a is an odd number, ea can be calculated efficiently by Math. 11 below. In the mathematical formulae in the description, sa is expressed as $s_a$, sa+1 is expressed as $s_{a+1}$, Br0 is expressed as $B^{r0}$ and Br1 is expressed as $B^{r1}$.

$$e_a = rank0(B, e_a) + rank1(B, e_a) =$$
$$rank0(B, s_a) + rank1(B, s_{a+1}) =$$
$$select1\left(B^{r0}, \frac{a-1}{2}\right) + select1\left(B^{r1}, \frac{a-1}{2}\right)$$

[Math. 11]

In the above-described Math. 11, the following fact is used. That is, since only is are included in the interval [sa, ea), rank0(B, ea)=rank0(B, sa) holds. Similarly, since only 0s are included in the interval [ea, sa+1), rank1(B, ea)=rank1 (B, sa+1) holds. The value of rank0 at sa is recorded as the position of the ((a−1)/2+1)th 1 in Br0. The value of rank1 at sa+1 is recorded as the position of the ((a−1)/2+1)th 1 in Br1. Thus, by summing results of calculation of select1 with the respective fully indexable dictionaries, the value of ea is calculated.

Since the value of ea has been obtained in this way, the value of access(B, i) is then calculated by comparing the value of ea with the value of i, as described afore.

In order to calculate rank1(B, i), the calculation unit 20 may consider cases separately in a similar manner. If i<ea, the sought solution can be calculated by Math. 12 below.

rank1(B,i)=rank1(B,$s_a$)+(i−$s_a$)=$s_a$−rank0(B,$s_a$)+
(i−$s_a$)=i−rank0(B,$s_a$) [Math. 12]

The reason that the sought solution can be calculated by the above-described Math. 12 is that it is insured that whole of the interval [sa, i) is occupied by is. Since rank0(B, sa) has already been calculated during the calculation of ea, merely subtracting the two values provides the sought solution.

On the other hand, if ea<=i, the sought solution can be calculated by Math. 13 below.

rank1(B,i)=rank1(B,$s_a$)+($e_a$−$s_a$)=rank1(B,$s_{a+1}$) [Math. 13]

The reason that the sought solution can be calculated by the above-described Math. 13 is that, while the whole of interval [sa, ea) is occupied by is completely, the interval [ea, i) is occupied by 0s completely. The value of rank1(B, sa+1) has already been calculated in calculating ea.

Consequently, it has been shown that when a is an odd number, access(B, i) and rank1(B, i) can be calculated.

Using the bit stream B illustrated in FIG. 3, a specific calculation example in which a is an odd number will now be described below. In the calculation example, it is assumed that i=5. That is, it is assumed that access(B,5) or rank1(B,5) is to be obtained.

In this case, since a=rank1(B1,5+1)=1, a is an odd number. Thus, the first (a=1) run and the second (a+1=2) run are given attention. Therefore, ea comes to have a value shown in Math. 14 below.

[Math. 14]

$$e_a = rank0(B, e_a) + rank1(B, e_a) = rank0(B, s_a) + rank1(B, s_{a+1})$$
$$= select1\left(B^{r0}, \frac{a-1}{2}\right) + select1\left(B^{r1}, \frac{a-1}{2}\right)$$
$$= select1(B^{r0}, 0) + select1(B^{r1}, 0) = 2 + 3 = 5$$

$$rank1(B, i) = rank1(B, s_a) + (e_a - s_a) = rank1(B, s_{a+1})$$

Since, from the above-described Math. 15, it results that ea≤i holds, the position of i is between the first run and the second run. That is, access(B, i)=B[i]=0. Furthermore, rank1 has a value shown in Math. 15 below.

rank1($B,i$)=rank1($B,s_{a+1}$)=3  [Math. 15]

Subsequently, a calculation method in which a is an even number will be described below. First, values of the position sa and the position sa+1 will be obtained. The values are calculated as sa=select1(B1, a−1) and sa+1=select1(B1, a). It should be noted that, since the fully indexable dictionary of a sparse bit stream described in NPL 1 is used for a bit stream B1, an a value can be calculated without searching for sa and sa+1 values. That is because in the fully indexable dictionary, the a-th element and the (a+1)th element are stored adjacent to each other in a storage area, and it is not required to perform a search again. If sa=i in this case, it results that i is the start position of the run and B[i]=1, and it thus results that access(B, i)=1, without having to perform any more calculation.

After the specific value of sa and sa+1 values have been obtained, a value of ea is calculated specifically by Math. 16 below.

[Math. 16]

$$e_a = rank0(B, e_a) + rank1(B, e_a) = rank0(B, s_a) + rank1(B, s_{a+1})$$
$$= (s_a - rank1(B, s_a)) + (s_{a+1} - rank0(B, s_{a+1}))$$
$$= \left(s_a - select1\left(B^{r1}, \frac{a}{2} - 1\right)\right) + \left(s_{a+1} - select1\left(B^{r0}, \frac{a}{2}\right)\right)$$

Since the value of ea has been obtained in this way, the calculation unit 20 subsequently compares the value of ea with the value of i value to calculate a value of access(B, i), as described above.

Calculation of rank1(B, i) is carried out in a similar manner to the calculation as in the case that a is an odd number. That is, if i<ea, the sought solution can be calculated by rank1(B, i)=i−rank0(B, sa). On the other hand, if ea≤i, the sought solution is calculated as rank1(B, i)=rank1(B, sa+1).

As described above, the use of the data structure 11 enables the calculation unit 20 to calculate access and rank1. Practically, the calculation unit 20 calculates rank1 on the bit stream B1 once, calculates select1 on the bit stream Br1 once, and calculates select1 on the bit stream Br0 once. Since rank0(B, i) is equal to "i−rank1(B, i)", rank0(B, i) can be easily calculated from a value of rank1.

Using the bit stream B illustrated in FIG. 3, a specific calculation example in a case that a is an even number will now be described below. In this calculation example, it is assumed that i=9. That is, it is assumed that access(B,9) or rank1(B,9) is to be obtained.

In this case, a is calculated as a=rank1(B1,9+1)=2, which is an even number. Therefore, the second (a=2) run and the third (a+1=3) run are given attention.

First, values of the position of sa and the position of sa+1 will be obtained. The values are calculated as sa=select1(B1, a−1)=select1(B1,1)=7 and sa+1=select1(B1, a)=select1(B1, 2)=10. Therefore, ea comes to have a value shown by Math. 17 below.

[Math. 17]

$$e_a = rank0(B, e_a) + rank1(B, e_a) = rank0(B, s_a) + rank1(B, s_{a+1})$$
$$= \left(s_a - select1\left(B^{r1}, \frac{a}{2} - 1\right)\right) + \left(s_{a+1} - select1\left(B^{r0}, \frac{a}{2}\right)\right)$$
$$= (s_a - select1(B^{r1}, 0)) + (s_{a+1} - select1(B^{r0}, 1)) = (7 - 3) + (10 - 5) = 9$$

Since ea≤i holds from the above-described Math. 17, then access(B, i)=B[i]=0. Moreover, rank1 comes to have a value shown by Math. 18 below.

rank1($B,i$)=rank1($B,s_{a+1}$)=5  [Math. 18]

Subsequently, a calculation method of select1(B, i) in the bit stream B will be described below using FIG. 7. FIG. 7 is a diagram schematically describing the calculation method of select1(B, i) in the example of the present invention. First, the calculation unit 20 calculates a=rank1(Br1, i+1). The calculation is performed to obtain the appearance order (when counted among the even-numbered runs) of a run that is an even-numbered run and the rank1 value of which at the start position thereof does not surpass i the order of which is largest. While such a run is the a-th run among the even-numbered runs, the run is the (a*2)th run among all the runs, including the odd-numbered runs and the even-numbered runs.

Three runs, namely the (a*2)th run, the (a*2+1)th run and the (a*2+2)th run, which are illustrated in FIG. 7, are now given attention. The target i exists on either the (a*2)th run or the (a*2+1)th run. Run where i exists is obtained by comparing a value of rank1 at the start position sa*2+1 of the (a*2+1)th run, that is, b=rank1(B, sa*2+1), with i. However, since the (a*2+1)th run is an odd-numbered run, a value of rank at the start position of the (a*2+1)th run is not directly preserved in the data structure 11 (fully indexable dictionary), and, thus, the calculation unit 20 is required to calculate b from a value of position and a value of rank0. The value of b can be calculated using Math. 19 below. In this case, a value of rank0 c (=rank0(B, sa*2+1)) at the start position of the (a*2+1)th run in Math. 19 below is held.

b=rank1($B,s_{a*2+1}$)=$s_{a*2+1}$−rank0($B,s_{a*2+1}$)=select1
($B^1,a*2$)−select1($B^{r0},a$)  [Math. 19]

Since b is obtained by the above-described Math. 19, the calculation unit 20 compares i and b. If the comparison result is i<b, the sought position exists on the (a*2)th run. The start position of the run is obtained by sa*2=select1(B1, a*2−1). A value of rank1 at a position in the (a*2)th run is calculated by d=rank1(B, sa*2)=select1(Br1, a−1). Since the a-th element has already been found in the step a=rank1(Br1, i+1) was first calculated, the calculation unit 20 may calculate the above value without another search. The sought solution is given by sa*2+(i−d).

On the other hand, if b<=i, the sought position exists in the (a*2+1)th run. Thus, the sought solution is given by i+c. That is because only i number of 1s and c number of 0s exist before the position that becomes the solution, the position should be given by i+c.

As described above, the calculation unit 20 may calculate a solution of select1 using the data structure 11. While there is a case in which the calculation yields that a=0 when a value of a is first calculated, exactly the same calculation may be performed even in this case. In this case, since the (a*2)th run does not exist, i exists on the (a*2+1)th run without exception. In this case, since the above-described b always becomes 0, i<b never holds.

In the example, the calculation unit 20 may appear to read out the same data structure 11 repeatedly at a glance. However, the calculation unit 20 only references elements adjacent to an element that has been found once, and only one search operation of the data structure 11 by the calculation unit 20 is thus required. That is, on three occasions, namely rank1 calculation for the bit stream Br1, select1 calculation for the bit stream B1, and select1 calculation for the bit stream Br0, the data structure 11 is read out.

A calculation example of calculating select1(B, i) where i=4, that is, select1(B,4), will now be described using the bit stream B illustrated in FIG. 3. In this case, since a=rank1 (Br1,4+1)=1, it is calculated as: a*2=2; and a*2+1=3. Thus, the results show that the sought position exists on either the second run or the third run. Calculation of a value b of rank1 at the start position of the third run by the calculation unit 20 yields a result as shown by Math. 20 below.

$$b=\text{rank1}(B,s_{a*2+1})=s_{a*2+1}-\text{rank0}(B,s_{a*2+1})=\text{select1}(B^1,a*2)-\text{select1}(B^{r0},a)=10-5=5 \quad [\text{Math. 20}]$$

In the above-described Math. 20, a value of rank0 c (=rank0(B, sa*2+1)=5) at the start position of the (a*2+1)th run is held. Since i<b holds as a result of comparison between i=4 and b=5, the calculation unit 20 determines that the sought position exists in the (a*2)th run. The start position of the run is calculated as sa*2=select1(B1, a*2−1)=7. The value of rank1 at the position is calculated as d=rank1(B, sa*2)=select1(Br1, a−1)=3. Thus, the sought solution is obtained as sa*2+(i−d)=7+(4-3)=8. When i=6 is assumed, since b≤i holds while the value of b is the same, the solution is calculated as i+c=6+5=11.

The calculation unit 20 may also calculate select0(B, i) in the similar way as in calculating select1(B, i). However, the relation between even numbers and odd numbers, and the relation between runs and spaces are reversed. First, the calculation unit 20 calculates a=rank1(Br0, i+1). The calculation is performed to obtain the appearance order (when counted among the odd-numbered runs) of a run that is an odd-numbered run and the value of rank0 of which at the start position thereof does not surpass i the order of which is largest.

When the calculation yields that a=0, it results that the (i+1)th 0, which is being searched, appears before the first run. This means that whole of the interval B[0, i] is occupied by 0s. Thus, the sought solution is obtained as select0(B, i)=i. In the following description, a case in which a>0 holds is considered.

An a-th run among the odd-numbered runs is an (a*2−1)th run among all the runs including the odd-numbered runs and the even-numbered runs. Thus, three runs, namely, the (a*2−1)th run, the (a*2)th run and the (a*2+1)th run are given attention.

The target i exists on either the space sandwiched between the (a*2−1)th run and the (a*2)th run, or the space sandwiched between the (a*2)th run and the (a*2+1)th run. Space where i exists is obtained by comparing a value of rank0 at the start position sa*2 of the (a*2)th run, that is, b=rank0(B, sa*2), with i.

However, since the (a*2)th run is an even-numbered run, the value of rank0 at the start position of the (a*2)th run is not preserved in the fully indexable dictionary directly. Thus, it is required to calculate the value of rank0 from a value of position and a value of rank1. This value can be calculated by using Math. 21 below.

$$b=\text{rank1}(B,s_{a*2+1})=s_{a*2+1}-\text{rank0}(B,s_{a*2+1})=\text{select1}(B^1,a*2)-\text{select1}(B^{r0},a)=10-5=5 \quad [\text{Math. 21}]$$

In the above-described Math. 21, a value c of rank1 (=rank1(B, sa*2)) at the start position of the (a*2)th run is held. Then, i and b are compared. If the comparison result is that i<b, the sought position exists in the space sandwiched between the (a*2−1)th run and the (a*2)th run. In that case, the sought solution is i+c. That is because i number of 0s and c number of 1s exist before the sought position.

On the other hand, if b<=i, the sought position exists in the space sandwiched between the (a*2)th run and the (a*2+1)th run. When a value of rank1 at the start position of the (a*2+1)th run is denoted by d, d can be calculated by using Math. 22 below.

$$d=\text{rank1}(B,s_{a*2+1})=s_{a*2+1}-\text{rank0}(B,s_{a*2+1})=\text{select1}(B^1,a*2)-\text{select1}(B^{r0},a) \quad [\text{Math. 22}]$$

The sought solution is i+d. That is because i number of 0s and d number of 1s exist before the sought position.

A calculation example of obtaining select0(B, i) where i=2, that is, select0(B,2), will now be described using the bit stream B illustrated in FIG. 3. In this case, since a=rank1 (Br0,2+1)=1, it is calculated as a*2−1=1 and a*2=2. Thus, it results that the sought position exists on either the space sandwiched between the first run and the second run or the space sandwiched between the second run and the third run. Calculation of a value b of rank0 at the start position of the second run yields a result as shown by Math. 23 below.

$$b=\text{rank0}(B,s_{a*2})=s_{a*2}-\text{rank1}(B,s_{a*2})=\text{select1}(B,a*2-1)-\text{select1}(B^{r1},a-1)=7-3=4 \quad [\text{Math. 23}]$$

In the above-described Math. 23, a value of rank1 c (=rank1(B, sa*2)=3) at the start position of the (a*2)th run is preserved. Since i<b holds as a result of comparison between i=2 and b=4, the calculation unit 20 determines that the sought position exists in the space sandwiched between the (a*2−1)th run and the (a*2)th run. As a result, the sought solution is obtained as i+c=2+3=5.

A case of i=4 is considered. In this case, while calculation up to obtaining b=4 is the same, b≤i holds. Thus the calculation unit 20 determines that the sought position exists in the space sandwiched between the (a*2)th run and the (a*2+1)th run. A value of rank1 at the start position of the (a*2+1)th run is now denoted by d. The value of d is calculated by Math. 24 below.

$$d=\text{rank1}(B,s_{a*2+1})=s_{a*2+1}-\text{rank0}(B,s_{a*2+1})=\text{select1}(B^1,a*2)-\text{select1}(B^{r0},a)=10-5=5 \quad [\text{Math. 24}]$$

From the calculation result in the above-described Math. 24, the sought solution is i+d=4+5=9.

As described above, the information processing device 100 described in the exemplary embodiment and the examples may perform all the operations, namely, access, rank1, rank0, select1 and select0 using the data structure (fully indexable dictionary). Whichever operation is performed, an objective value is obtained by performing rank or select operation several times in the fully indexable dictionary, which is constructed with three sparse bit streams. That is, a computational complexity required in the example becomes the same order as that of rank or select operation in a fully indexable dictionary that is constructed with a sparse bit stream, which enables processing of such operations with sufficiently high speed from a practical perspective.

As described above, in the technology disclosed in NPL 2, while a bit stream that holds values of rank1 exists, no bit stream that holds value of rank0s exists, and it has thus been impossible to calculate select0 rapidly. On the other hand, in the example, recording rank1 and rank0 alternately in the data structure 11 enables select0 and select1 to be calculated with high speed while keeping the size of the data structure 11 at substantially the same size as that of the fully indexable dictionary disclosed in NPL 2.

While the above-described exemplary embodiment and the example may be regarded as an embodiment of preserving the values of rank1 in a data structure, they may also be regarded as an embodiment of representing run lengths in unary codes. However, while a bit stream generated by simply representing run lengths in unary codes is used in the technique disclosed in NPL 2, two bit streams including a bit stream generated by representing the total value of the lengths of two runs sandwiching a space in unary codes and a bit stream generated by representing the total value of the lengths of two spaces sandwiching a run in unary codes, are used in the above-described exemplary embodiment and example. This feature is a devised point that substantially differs from a conventional run-length compression method in which the length of succeeding identical signs is encoded as it is.

INDUSTRIAL APPLICABILITY

As described above, the present invention enable suppression of an increase in the size of a fully indexable dictionary while enabling a target bit stream to be subjected to two types of selection operations employing the fully indexable dictionary. The present invention is useful for a system required to perform search and, in particular, for a system that uses a wavelet tree structure.

The present invention has been explained with the above-described exemplary embodiment as an exemplary example. However, the present invention is not limited to the above-described exemplary embodiment. In other words, various aspects of the present invention that could be understood by those skilled in the art may be applied within the scope of the present invention.

This application claims priority based on Japanese Patent Application No. 2014-073545, filed on Mar. 31, 2014, the entire disclosure of which is incorporated herein by reference.

REFERENCE SIGNS LIST

10 Storage unit
11 Data structure
12 Succession segment position data (first data)
13 rank1 data (second data)
14 rank0 data (third data)
20 Calculation unit
21 First select calculation unit
22 Second select calculation unit
23 First rank calculation unit
24 Second rank calculation unit
30 Input reception unit
40 Output unit
100 Information processing device
110 Computer
111 CPU
112 Main memory
113 Storage device
114 Input interface
115 Display controller
116 Data reader/writer
117 Communication interface
118 Input device
119 Display device
120 Recording medium
121 Bus

What is claimed is:

1. An information processing device, comprising:
a processor; and
a storage for storing a data structure representing a bit stream composed of a first values and second values, the data structure including
first data representing a start position of individual runs, each of the runs being a region of succession of the first values in the bit stream,
second data representing a number of the first values between a head of the bit stream and each run for the bit stream, and
third data representing a number of the second values between the head of the bit stream and each run for the bit stream, wherein
for each run, at least two values out of three values including a position of the run, the number of the first values and the number of the second values are specified by the first data, the second data or the third data, and the at least two values to be specified vary depending on the position of the run,
the first data specify positions of all of the run each of which includes a succession of first values on the bit stream,
a run for which the second data specify the number of the first values coincides with the run that appears in an even-numbered position, and
a run for which the third data specify the number of the second values coincides with the run that appears in an odd-numbered position.

2. The information processing device according to claim 1, wherein the processor configured to function as:
a first select calculation unit configured to specify a first select position on the bit stream at which the first values count included in an interval from the beginning to the position coincides with a natural number using the first data, the second data and the third data when the natural number is input; and
a second select calculation unit configured to specify a second select position on the bit stream at which the second values count included in an interval from the beginning to the position coincides with the natural number using the first data, the second data and the third data when the natural number is input.

3. The information processing device according to claim 2, wherein
the first select calculation unit further configured to:
estimate the run which the appearances of the first values is specified in the second data and which the first select position of a specific subject exists in or exists close to, based on the number of the first values, which the second data specify, specify the number of the first values based on the first data and the third data for the succession segment that exists close to the estimated run and for which the number of the first value is not specified in the second data, and specify the first select position using the number of the first values specified.

4. The information processing device according to claim 2, wherein the second select calculation unit further configured to:

estimate the run which the number of the second values is specified in the third data and which the second select position of a specific subject exists in or exists close to based on the number of the second values which the third data specify, specify the number of the second values, based on the first data and the second data for a run that exists close to the estimated run and for which the of the second values is not specified in the third data, and specify the second select position using the number of the second values specified.

5. The information processing device according to claim 1, wherein the data structure is compressed by regarding each of the positions that the first data specify, the number of the first values that the second data specify and the number of the second values that the third data specify as a monotonically increasing sequence, and stored in the storage while being compressed.

6. A non-transitory recording medium recording a data structure for restoring a bit stream formed using first values and second values, comprising:

first data representing a start position of individual runs, each of the runs being a region of succession of the first values in the bit stream;

second data representing a number of the first values between a head of the bit stream and each run for the bit stream; and third data representing a number of the second values between the head of the bit stream and each run for the bit stream, wherein out of a run the position of which the first data specify, a run for which the second data specify the number of the first values, and a run for which the second data specify the number of the second values, two run coincide with each other or all run differ from one another, the first data specify positions of all runs each of which includes a succession of one or more first values on the bit stream, a run for which the second data identify number of the first values coincides with the run that appears in an even-numbered place, and a run for which the third data identify number of the second values coincides with the run that appears in an odd-numbered place.

7. An information processing method by a computer using a data structure on a bit stream formed using first values and second values, the method comprising:

a step (a) of specifying a first select position using first data, second data and third data when a natural number is input, the first select position being a position on the bit stream and the first values count included in an interval from the beginning to the position coinciding with the natural number at the first select position, the first data representing a start position of individual runs, each of the runs being a region of succession of the first values in the bit stream and each run for appeared in the bit stream and the third data representing a number of the second values between the head of the bit stream and each run for; and a step (b) of specifying a second select position using the first data, the second data and the third data when the natural number is input, the second select position being a position on the bit stream and the second values count included in an interval from the beginning to the position coincides with the natural number at the second select position, wherein at least two values out of three values including a position of the run, the number of the first values, and the number of the second values are specified by the first data, the second data or the third data, and the at least two values to be specified vary depending on the position of the run for each run, the first data specify positions of all run each of which includes a succession of one or more first values on the bit stream, the run for which the second data specify the number of the first values coincides with the run that appears in an even-numbered place, and the run for which the third data specify the number of the second values coincides with the run that appears in an odd-numbered place.

8. The information processing method according to claim 7, wherein in the step (a), estimate the run for which the number of the first values is specified in the second data and which the first select position to be subjected to specification exists in or exists close to, based on the number of the first values which the second data specify, further specify the number of the first values for the run that exists close to the estimated run and for which the number of the first values is not specified in the second data based on the first data and the third data, and specify the first select position using the specified number of the first values.

9. The information processing method according to claim 7, wherein in the step (b), estimate the run for which the number of the second values is specified in the third data and which the second select position to be subjected to specification exists in or exists close to, based on the number of the second values, which the third data specify, further specify the number of the second values for the run that exists close to the estimated run and for which the number of the second values is not specified in the third data based on the first data and the second data, and specify the second select position using the specified number of the second values.

10. A non-transitory program recording medium recording a program that makes a computer execute:

a step (a) of storing, into a storage device included in the computer, a data structure including first data representing a start position of individual runs, each of the runs being a region of succession of the first values in a bit stream; second data representing a number of the first values between a head of the bit stream and each run for the bit stream; and third data representing a number of the second values between the head of the bit stream and each run for the bit stream;

a step (b) of specifying a first select position using the first data, the second data and the third data when a natural number is input, the first select position being a position on the bit stream and the first values count included in an interval from the beginning to the position coinciding with the natural number at the first select position; and a step (c) of, specifying a second select position using the first data, the second data and the third data when a natural number is input, the second select position being a position on the bit stream and the second values count included in an interval from the beginning to the position coinciding with the natural number at the second select position, wherein at least two values out of three values including a position of the run, the number of the first values, and the number of the second values are specified by the first data, the second data or the third data, and the at least two values to be specified vary depending on the position of the run for each succession segment, the first data specify positions of all runs each of which includes a succession of one or more first values on the bit stream, the run for which the second data specify the number of the first values coincides with the run that appears in an even-numbered place, and the run for which the third data specify the number of the second values coincides with the run that appears in an odd-numbered place.

11. The non-transitory program recording medium according to claim 10, wherein
in the step (b),
estimate the run for which the number of the first values is specified in the second data and which the first select position to be subjected to specification exists in or exists close to, based on the number of the first values, which the second data specify,
further specify the number of the first values for a run that exists close to the estimated run and for which the number of the first values is not specified in the second data based on the first data and the third data, and
specify the first select position using the specified number of the first values.

12. The non-transitory program recording medium according to claim 10, wherein
in the step (c),
estimate the run for which the number of the second values is specified in the third data and which the second select position to be subjected to specification exists in or exists close to, based on the number of the second values, which the third data specify,
further specify the number of the second values for a run that exists close to the estimated run and for which the appearance count of the second values is not specified in the third data based on the first data and the second data, and
specify the second select position using the specified number of the second values.

13. The non-transitory program recording medium according to claim 10, wherein
in the step (a), the data structure is compressed by regarding each of the positions that the first data specify, the numbers of appearances of the first values that the second data specify, and the numbers of appearances of the second values that the third data specify as a monotonically increasing sequence and stored in the storage device while being compressed.

* * * * *